United States Patent
Stöckel et al.

(10) Patent No.: US 7,981,987 B2
(45) Date of Patent: Jul. 19, 2011

(54) AROMATIC URETHANE ACRYLATES HAVING A HIGH REFRACTIVE INDEX

(75) Inventors: Nicolas Stöckel, Köln (DE); Friedrich-Karl Bruder, Krefeld (DE); Jan Weikard, Ordenthal (DE)

(73) Assignee: Bayer MaterialScience AG, Leverkusen (DE)

( * ) Notice: Subject to any disclaimer, the term of this patent is extended or adjusted under 35 U.S.C. 154(b) by 563 days.

(21) Appl. No.: 12/100,828

(22) Filed: Apr. 10, 2008

(65) Prior Publication Data

US 2008/0312403 A1    Dec. 18, 2008

Related U.S. Application Data

(60) Provisional application No. 60/922,988, filed on Apr. 11, 2007.

(51) Int. Cl.
*C08F 26/02* (2006.01)

(52) U.S. Cl. ..................................................... 526/301

(58) Field of Classification Search .................. 526/301
See application file for complete search history.

(56) References Cited

U.S. PATENT DOCUMENTS

| | | | |
|---|---|---|---|
| 5,916,987 A | 6/1999 | Kobayashi et al. | |
| 6,486,225 B1 | 11/2002 | Kamata et al. | |
| 6,780,546 B2 | 8/2004 | Trentler et al. | |
| 6,794,471 B2 | 9/2004 | Ohkuma et al. | |
| 2001/0007736 A1 | 7/2001 | Takasaki et al. | |
| 2005/0018260 A1 | 1/2005 | Hirao et al. | |

FOREIGN PATENT DOCUMENTS

| | | |
|---|---|---|
| EP | 1 014 113 A2 | 6/2000 |
| EP | 1 548 039 A1 | 6/2005 |
| JP | 2004-264834 | 9/2004 |
| JP | 2004-295058 A | 10/2004 |
| JP | 2006-307159 | 11/2006 |

*Primary Examiner* — Edward J Cain
(74) *Attorney, Agent, or Firm* — Connolly Bove Lodge & Hutz LLP

(57) ABSTRACT

The invention relates to novel aromatic urethane (meth)acrylates having a high refractive index, a process for the preparation thereof and a process for the production of holographic media.

10 Claims, 1 Drawing Sheet

AROMATIC URETHANE ACRYLATES HAVING A HIGH REFRACTIVE INDEX

CROSS-REFERENCE TO RELATED APPLICATION

This application claims priority under 35 U.S.C. §119 (e) to provisional application Ser. No. 60/922,988, filed Apr. 11, 2007, the disclosure of which is incorporated by reference for all useful purposes.

FIELD OF THE INVENTION

The invention relates to novel olefinically unsaturated urethanes having a high refractive index and a process for the preparation thereof.

BACKGROUND OF THE INVENTION

In the area of optical applications, the refractive index is an important material property. Thus, it plays an important role, for example, for the production of optical components, such as lenses, prisms and optical coatings (U.S. Pat. No. 5,916,987) or for the production of a contrast in holographic materials (U.S. Pat. No. 6,780,546). For such and similar applications, there is a need to be able to adjust the refractive index in a targeted manned, for example by admixing components having a high refractive index.

For the abovementioned fields of use, polymers of olefinically unsaturated compounds, such as, preferably, (meth) acrylates, are typically used. In order to reach the refractive index of 1.5 or higher, halogen-substituted aromatic (meth) acrylates or special alkyl methacrylates described in U.S. Pat. No. 6,794,471 can be used. Particularly the latter are disadvantageous owing to their complicated preparation.

The class of substances consisting of the urethane (meth) acrylates is well known per se from the area of coating technology. According to the prior art, however, the extent to which these are suitable for the production of data media, in particular those for holographic storage methods, is not known.

SUMMARY OF THE INVENTION

It was the object of the present invention to provide novel olefinically unsaturated urethanes, preferably urethane acrylates or urethane methacrylates which are technically as simple as possible to prepare and are suitable for the production of optical data media, in particular for holographic storage methods It has now been found that olefinically unsaturated urethanes, preferably urethane acrylates or urethane methacrylates having a refractive index at λ=532 nm of at least 1.5 meet the above requirements.

The invention therefore relates to a process for the production of holographic media, in which olefinically unsaturated aromatic urethanes, preferably urethane acrylates and/or urethane methacrylates having a refractive index at λ=532 nm of $\geq 1.5$ are used.

DESCRIPTION OF THE DRAWINGS

The invention is further illustrated by the following non-limiting drawing in which.

DETAILED DESCRIPTION OF THE INVENTION

Figure 1:
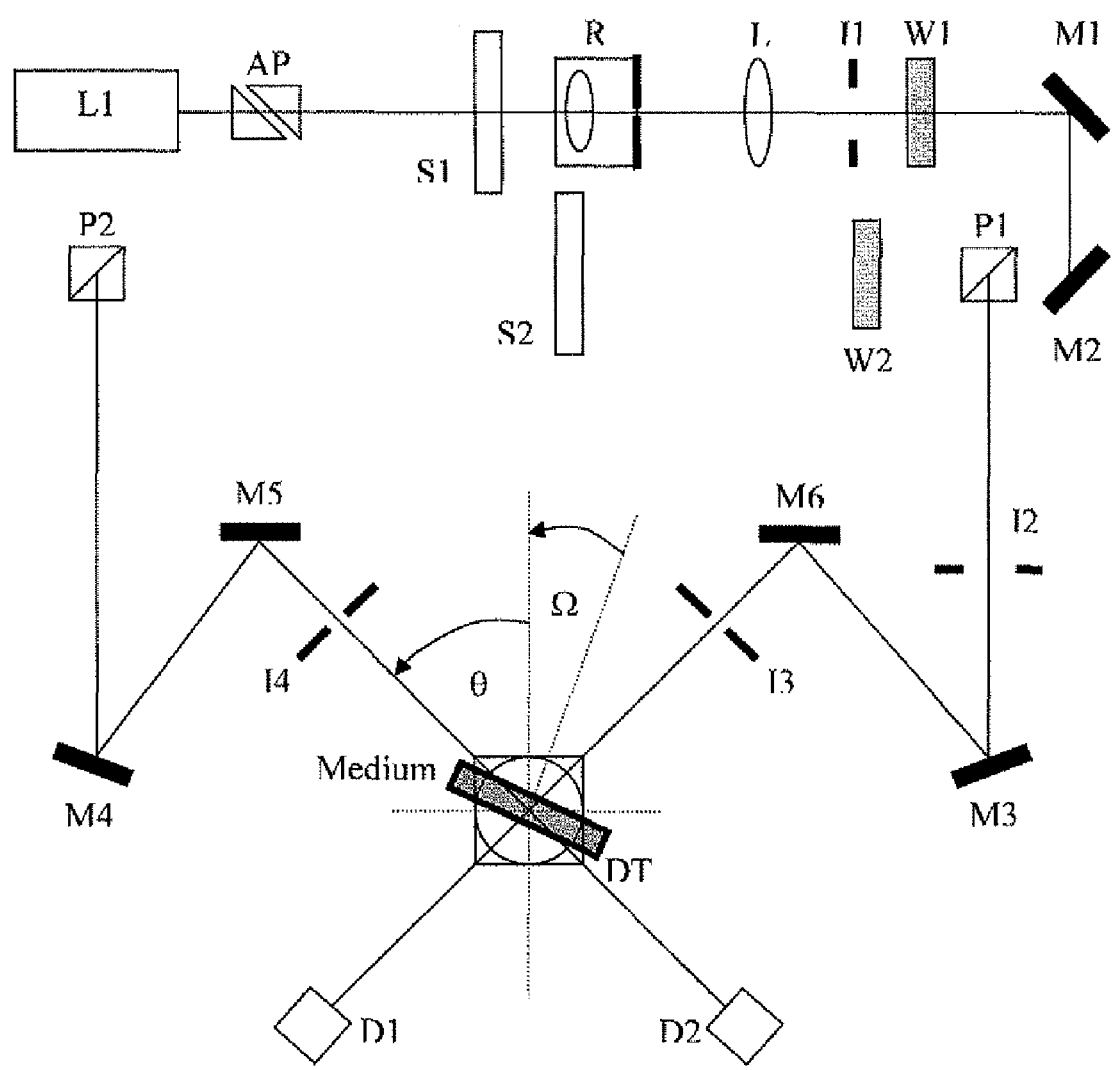
FIG. 1 shows the holographic test setup with which the dynamic range, the M#, of the media was measured.

As used herein in the specification and claims, including as used in the examples and unless otherwise expressly specified, all numbers may be read as if prefaced by the word "about", even if the term does not expressly appear. Also, any numerical range recited herein is intended to include all subranges subsumed therein.

The olefinically unsaturated aromatic urethanes, preferably urethane acrylates and/or urethane methacrylates of the present invention preferably have a refractive index of $\geq 1.55$, particularly preferably $\geq 1.58$, at λ=532 nm.

The olefinically unsaturated urethanes, preferably urethane acrylates and/or urethane methacrylates of the present invention are obtainable in a manner well known per se by reacting A) aromatic polyisocyanates with B) isocyanate-reactive compounds having at least one radiation-curing olefinically unsaturated double bond.

The aromatic di- and/or triisocyanate well known per se to the person skilled in the art can be used as polyisocyanates.

Examples of such di- or triisocyanate are 1,4-phenylene diisocyanate, 2,4- and/or 2,6-toluene diisocyanate, 1,5-naphthylene diisocyanate, 2,4,- or 4,4'-diphenylmethane diisocyanate, triphenylmethane 4,4',4"-triisocyanate and tris(p-isocyanatophenyl) thiophosphate.

1,5-Naphthylene diisocyanate, triphenylmethane 4,4',4"-triisocyanate and tris(p-isocyanatophenyl) thiophosphate are preferred. Triphenylmethane 4,4',4"-triisocyanate and tris(p-isocyanatophenyl) thiophosphate are particularly preferred.

Also suitable are the higher molecular weight secondary products based on the above di- or triisocyanates and having a urethane, urea, carbodiimide, acylurea, isocyanurate, allophanate, biuret, oxadiazinetrione, uretdione or iminooxadiazinedione structure and mixtures thereof.

All compounds which have at least one group reactive toward isocyanates and at least one unsaturated function which reacts with ethylenically unsaturated compounds with polymerization under the action of actinic radiation (radiation-curing group) can be used individually or in any desired mixtures as compounds of component B).

Acrylates, methacrylates, maleinates, fumarates, maleimides, acrylamides, and vinyl ether, propenyl ether, ally ether and compounds containing dicyclopentadienyl units, which have at least one group reactive toward isocyanates, are preferably used in compound B); these are particularly preferably acrylates and methacrylates having at least one isocyanate-reactive group.

Suitable hydroxy-functional acrylates or methacrylates are, for example, compounds such as 2-hydroxyethyl(meth) acrylate, polyethylene oxide mono(meth)acrylates, poly-propylene oxide mono(meth)acrylates, polyalkylene oxide mono(meth)acrylates, poly(c-caprolactone) mono(meth) acrylates, such as, for example, Tone® M100 (Dow, Schwalbach, Germany), 2-hydroxypropyl (meth)acrylate, 4-hydroxybutyl (meth)acrylate, 3-hydroxy-2,2-dimethylpropyl (meth)acrylate, hydroxypropyl (meth)acrylate, 2-hydroxy-3-phenoxypropyl acrylate, the hydroxyfunctional mono-, di- or tetraacrylates of polyhydric alcohols, such as trimethylolpropane, glycerol, pentaerythritol, dipentaerythritol, ethoxylated, propoxylated or alkoxylated trimethylolpropane, glycerol, pentaerythritol, dipentaerythritol or industrial mixtures thereof.

In addition, isocyanate-reactive oligomeric or polymeric unsaturated compounds containing acrylate and/or methacrylate groups are suitable alone or in combination with the abovementioned monomeric compounds.

The epoxy(meth)acrylates known per se, containing hydroxyl groups and having OH contents of 20 to 300 mg KOH/g or polyurethane (meth)acrylates containing hydroxyl groups and having OH contents of 20 to 300 mg KOH/g or acrylated polyacrylates having OH contents of 20 to 300 mg KOH/g and mixtures thereof with one another and mixtures with unsaturated polyesters containing hydroxyl groups and mixtures with polyester (meth)acrylates or mixtures of unsaturated polyesters containing hydroxyl groups with polyester (meth)acrylates can likewise be used. Such compounds are likewise described in P. K. T. Oldring (Ed.), Chemistry & Technology of UV & EB Formulations For Coatings, Inks & Paints, Vol. 2, 1991, SITA Technology, London, pages 37-56. Epoxyacrylates containing hydroxyl groups and having a defined hydroxyl functionality are preferred.

Epoxy(meth)acrylates containing hydroxyl groups are based in particular on reaction products of acrylic acid and/or methacrylic acid with epoxides (glycidyl compounds) of monomeric, oligomeric or polymeric bisphenol A, bisphenol F, hexanediol and/or butanediol or the ethoxylated and/or propoxylated derivatives thereof. Epoxyacrylates having a defined functionality, as can be obtained from the known reaction of acrylic acid and/or methacrylic acid and glycidyl (meth)acrylate, are furthermore preferred.

2-Hydroxyethyl acrylate, hydroxypropyl acrylate, 4-hydroxybutyl acrylate, poly(ε-caprolactone) mono(meth)acrylates, pentaerytrityl triacrylate and hydroxyacrylates having a higher functionality in double bonds versus OH groups, such as the reaction product of acrylic acid with glycidyl methacrylate, are preferred.

2-Hydroxyethyl acrylate is particularly preferred.

In addition to the components A) and B), C) isocyanate-reactive compounds which contain no radiation-curing olefinically unsaturated double bonds, D), nanoparticulate fillers and/or E) stabilizers can also be concomitantly used for the production of the urethane acrylates of the present invention.

Isocyanate-reactive compounds of component C) are monomeric or oligomeric compounds and mixtures of one or more these compounds which have one or more isocyanate-reactive functionalities and no double bonds curable by actinic radiation.

Suitable compounds of component C) are low molecular weight short-chain mono- or polyfunctional alcohols, thiols or amines, i.e. containing 1 to 40 carbon atoms.

Suitable alcohols are, for example, aliphatic, araliphatic, aromatic or cycloaliphatic monoalcohols, diols, triols and higher polyols.

Examples of aliphatic alcohols are methanol, ethanol, n-propanol, isopropanol, n-butanol, isobutanol, sec-butanol, the isomeric pentanols, hexanols, 2-ethylhexanol, octanols and nonanols, n-decanol, n-dodecanol, n-tetradecanol, n-hexadecanol, n-octadecanol, cyclohexanol, the isomeric methylcyclohexanols or hydroxymethylcyclohexane, 3-ethyl-3-hydroxymethyloxetane or tetrahydrofurfuryl alcohol, diethylene glycol monoalkyl ethers, such as, for example, diethylene glycol monobutyl ether, diethylene glycol monomethyl ether, ethylene glycol monobutyl ether, diethylene glycol monobutyl ether, propylene glycol monomethyl ether, dipropylene glycol monomethyl ether, tripropylene glycol monomethyl ether, dipropylene glycol monopropyl ether, propylene glycol monobutyl ether, dipropylene glycol monobutyl ether, tripropylene glycol monobutyl ether, ethylene glycol, diethylene glycol, triethylene glycol, tetraethylene glycol, dipropylene glycol, tripropylene glycol, 4-methyl-5-thiazolylethanol, 2-(methylthio)ethanol, 4-hydroxymethyl-1,3-dithiolane, 2-methyl-4-hydroxymethyl-1,3-dithiolane, 2,4-dihydroxymethyl-1,3-dithiolane, 1,2-propanediol, 1,3-propanediol, 1,4-butanediol, neopentylglycol, 2-ethyl-2-butylpropanediol, trimethylpentanediol, positional isomers of diethyloctanediol, 1,3-butylene glycol, cyclohexanediol, 1,4-cyclohexanedimethanol, 1,6-hexanediol, 1,2- and 1,4-cyclohexanediol, hydrogenated bisphenol A (2,2-bis(4-hydroxycyclohexyl)propane), 2,2-dimethyl-3-hydroxypropyl 2,2-dimethyl-3-hydroxypropionate, 2,2'-thiodiethanol, 2,2'-dithiodiethanol, 2-mercapto-ethanol, 4-mercapto-1-butanol, 4-mercapto-2-butanol, 6-mercapto-1-hexanol, 3-mercapto-2-propanol, 3-mercapto-1-propanol, trimethylolethane, trimethylolpropane, glycerol, ditrimethylolpropane, pentaerythritol, dipentaerythritol, mannitol or sorbitol.

Examples of aromatic alcohols are phenol, the isomeric cresols, methoxyphenols, halogenated phenols, alkylphenols, alkoxyphenols, 1-naphthol, 2-naphthol, brominated naphthols, 9-hydroxyphenanthrene, hydroxypyrene, acetaminophenol, dihydroxynaphthalene, hydroquinone, hydroxycarbazole, hydroxyquinoline, 5-indanol, indolol, 4,4,-isopropylidenediphenol, mercaptophenol, phenoxyphenol and alkylated and/or halogenated and/or alkoxylated derivatives of said compounds.

Examples of araliphatic alcohols are benzyl alcohol, p-chlorobenzyl alcohol, p-bromobenzyl alcohol, p-iodobenzyl alcohol, 2,3,4,5,6-pentabromobenzyl alcohol, 2,4,6-trichlorobenzyl alcohol, 2,4,6-tribromobenzyl alcohol, anisyl alcohol, cinnamyl alcohol, 2-phenylethanol, 1-phenylethanol, 1-hydroxymethylnaphthalene, 2-hydroxymethylnaphthalene, 1-naphthaleneethanol, 2-naphthylethanol, 9-hydroxyfluorene, 1,8-naphthalenedimethanol, 2-thiophenemethanol, N-(2-hydroxy-ethyl)phthalimide, 4-(methylthio)benzyl alcohol, 1-acenaphthenol, 9-anthracenemethanol, 2-benzimidazolemethanol, benzoin, benzenedimethanol, 1-benzothiophenesulfo-2-methanol, N-benzylhydroxypiperidine, N-benzylpyrrolidinol, biphenyldimethanol, biphenylmethanol, 5H-dibenzo[a,d]cyclohepten-5-ol, fluorenylmethanol, fluorenylethanol, fluorenedimethanol, 2-(p-chlorophenyl)ethanol, diphenylethanol, diphenylmethanol, diphenylpropanol, triphenylmethanol, diphenyl-4-pyridylcarbinol, 1,4-dithiane-2,5-diol, 3,6-dithia-1,8-octanediol, dithiodiethanol, dithiodinaphthol, hydroxymethyldithiolane, furfuryl alcohol, hydrindantine, hydrobenzoin, hydroxybenzothiazole, hydroxybenzimidazol, hydroxycoumarine, 2-(2-hydroxyethoxy)phenol, 9-(2-hydroxyethyl)-9H-carbazole, N-(2-hydroxyethyl)aniline, 3-(2-hydroxyethyl)indole, N-(2-hydroxyethyl)phthalimide, 2-hydroxymethylanthraquinone, N-(hydroxymethyl)nicotinamide, N-(hydroxymethyl)phthalimide, N-(3-hydroxypropyl)phthalimide, 2-(3-hydroxy-propyl)pyridine, 2-pyridinemethanol, 9-hydroxy-9-phenylfluorene, 1-indanol, 2-indanol, indolemethanol, ethyl mandelate, benzyl mandelate, mandelonitrile, 2-mercaptobenzyl alcohol, 1-(2-naphthyl)ethanol, 1-(1-naphthyl)ethanol, 4,4-isopropylidenebis [2-phenoxyethanol], 4,4-isopropylidenebis[2-(2,6-dibromophenoxy)ethanol], 9,9-bis[4-(2-hydroxyethoxy) phenyl]fluorene, bisphenol A ethoyxlate, bisphenol F ethoxylate, benzhydrol, phenoxyethanol, phenoxypropanol, 1-phenyl-2-propanol, 2-phenyl-1-propanol, 3-phenyl-1-propanol, 9-phenyl-9-xanthenol, 9-hydroxyxanthene, pyridineethanol, pyridinemethanol, pyridinedimethanol, thiophenemethanol, thiopheneethanol and alkylated and/or halogenated and/or alkoxylated derivatives of said compounds.

Examples of suitable thiols are methanethiol, ethanethiol, propanethiol, butanethiol, pentanethiol, hexanethiol, heptanethiol, octanethiol, nonanethiol, dodecanethiol, octadecanethiol, 2-naphthalenemethanethiol, thiophenol, benzenedimethanthiol, benzenedithiol, diphenylmethanethiol, triphenylmethanethiol, dithioerythritol, dithiothreitole, ethanedithiol, 2,2'-thiodiethanthiol, furanmethanethiol, 2-mercaptobenzimidazole, 2-mercaptobenzothiazole, 2-mercaptobenzoxazole, bis(2-mercaptoethyl)ether, methyl 3-mercaptopropionate, isooctyl 3-mercaptopropionate, butyl 3-mercaptopropionate, mercaptopyridine, mercaptopyrimidine, 2-mercapto-2-thiazolin, methimazole, naphthalenethiol, pentaerythrityl tetrakis(3-mercapto-propionate), pentaerythrityl tetrakis(3-mercaptoacetate), phenoxyethanethiol, 2-phenylethanethiol, 4-mercaptomethyl-1,3-dithiolane, 4-(2-mercaptoethyl)-1,3-dithiolane, 2,4-dimercaptomethyl-1,3-dithiolane and 1,3-propanedithiol and alkylated and/or halogenated and/or alkoxylated derivatives of said compounds.

Examples of suitable amines are aniline, 1-naphthylamine, 2-naphthylamine, 2-aminothiazole, 2-aminobenzothiazole, 1-amino-4-bromonaphthalene, 2-aminobenzimidazole, aminochrysene, α-aminodiphenylmethane, 2-(2-aminoethyl) thiophene, 2-amino-5-(ethylthio)-1,3,4-thiadiazole, aminoindan, (atninomethyl)pyridine, aminomethylthiazole, 1-(aminomethyl)naphthalene, aminonaphthol, aminophenanthrene, aminophenol, aminopyrene, aminopyrazine, aminopyridine, aminopyrimidine, aminomethylpyridine, benzylamine, 2-benzylaminopyridine, biphenylethylamine, bis(2-aminophenyl) sulfide, carbazole, diaminonaphthalene, diaminotoluene, diphenylethylamine, dithiodinaphthylamine, furfurylamine, hydrazine, 1-(1-naphthyl)ethylamine, 1-(2-naphthyl)ethylamine, phenothiazine, phenoxazine, phenoxyaniline, phenoxyethylamine, 2-phenylethylamine, n-phenyl-1-naphthylamine, 1-phenylpropylamine, 2-phenylpropylamine, 3-phenylpropylamine, pyridimethylamine, thiophenemethylamine, and alkylated and/or halogenated and/or alkoxylated derivatives of said compounds.

Sulfur-containing compounds and 9-(2-hydroxyethyl)-9H-carbazole, hydroxymethylnaphthalene, N-(2-hydroxyethyl)phthalimide, 2-phenylethanol, (p-chloro)phenylethanol, 2-(p-chlorophenyl)ethanol, naphthalenethiomethanol and triphenylmethanol are preferred.

9-(2-Hydroxyethyl)-9H-carbazole, hydroxymethylnaphthalene, N-(2-hydroxyethyl)phthalimide and naphthalenethiomethanol are particularly preferred.

In a preferred embodiment, the urethane acrylates are composed of the above-mentioned components and have the following ideal chemical structures:

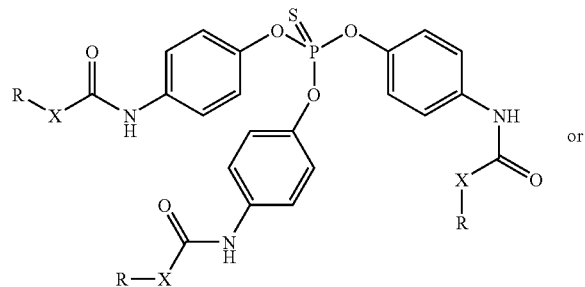

or

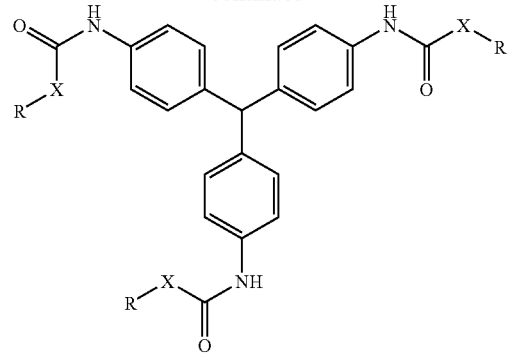

in which X is oxygen, amino or sulfur and

R in the respective formula comprises at least 30 mol % of olefinically unsaturated hydrocarbon radicals optionally containing heteroatoms and not more than 70 mol % of hydrocarbon radicals which optionally contain heteroatoms and are free of olefinically unsaturated groups.

Preferred olefinically unsaturated hydrocarbon radicals optionally containing heteroatoms are ethyl acrylate, propyl acrylate and/or butyl acrylate radicals.

Preferred hydrocarbon radicals which optionally contain heteroatoms and are free of olefinically unsaturated groups are 9H-carbazole, 9-ethyl-9H-carbazole, naphthalene, methylnaphthalene, N-ethylphthalimide, benzene, ethylbenzene, (p-chloro)ethylbenzene and/or triphenylmethane radicals.

Nanoparticulate fillers D) may optionally also be added to the urethane acrylates of the present invention. Both nonfunctional polymers and mineral fillers are suitable for this purpose.

The nonfunctional polymers and fillers are usually used for establishing mechanical and optical properties. All polymers and fillers which are compatible and homogenically miscible with the urethane acrylates according to the invention are suitable for this purpose.

The fillers can be used either as bulk material or in the form of particles having mean diameters in the range of 1 to 1000 nanometers, preferably of 1 to 500 nanometers, particularly preferably 2 to 200 nanometers.

Suitable nonfunctional polymers are polymers such as, for example, polyacrylates, polycarbonates, polyurethanes, polyolefins, polyethers, polyesters, polyamides and polyureas.

Metal salts, glass fibers and/or metallic fillers may be used as mineral fillers. Metal oxides, such as silicon dioxide, cerium dioxide, yttrium(III) oxide, zirconium dioxide, antimony(III) oxide, zinc oxide or tantalum oxide, are preferably used.

Stabilizers E) which may be used are compounds which stabilize double bonds curable by actinic radiation. In addition to oxygen-containing gas, chemical stabilizers are suitable for avoiding premature polymerization, in an amount of 0.01 to 1% by weight, preferably 0.1 to 0.5% by weight, based on the amount of the unsaturated compounds. Such stabilizers are described, for example, in Houben-Weyl, Methoden der organischen Chemie [Methods of organic Chemistry], 4th edition, volume XIV/I, Georg Thieme Verlag, Stuttgart 1961, pages 433 et seq. The following may be mentioned as examples: sodium dithionite, sodium hydrogen sulfide, sulfur, hydrazine, phenylhydrazine, hydra-zobenzene, N-phenyl-p-naphthyl amine, N-phenylethanoldiamine, dinitrobenzene, picric acid, p-nitrosodimethylaniline, diphenylnitrosamine, phenols, such as paramethoxy phenol, 2,5-di-tert-butylhydroquinone, 2,6-di-tert-butyl-4-methylphenol, p-tert-butyl-pyrocatechol or 2,5-di-tert-amylhydroquinone, tetramethylthiuram disulfide, 2-mercaptobenzthiazole, dimethyldithiocarbamic acid sodium salt, phenothiazine, N-oxyl compounds, such as, for example, 2,2, 6,6-tetramethylpiperidine N-oxide (TEMPO) or one of its derivatives. 2,6-Di-tert-butyl-4-methylphenol and para-methoxyphenol and mixtures thereof are preferred.

The urethane acrylates according to the invention are prepared by equivalent reaction of isocyanates A with isocyanate-reactive compounds B or B and C, so that the urethane acrylates according to the invention have a content of isocyanate groups (M=42) of less than 0.5% by weight, preferably less than 0.2% by weight, particularly preferably less than 0.1% by weight. Furthermore, the urethane acrylates according to the invention have contents of unconverted component B of less than 1% by weight, preferably less than 0.5% by weight and particularly preferably less than 0.2% by weight.

The reaction of A with B or of A with B and optionally C is a urethanization or a thiourethanization or a urea formation.

After the reaction of A with B or of A with B and C, further reactions known from the chemistry of the di- and polyisocyanates are possible, such as, for example, the further urethanization and/or the thiourethanization, the allophanatization, biuretization, trimerization, urea formation and/or uretdionization, optionally with further addition of compounds reactive with isocyanates, such as hydroxy, mercapto or amino compounds. Furthermore, additional amounts of di- or triisocyanates mentioned under A can be added for a possible further reaction. It is also possible to remove unconverted di- or triisocyanates by separation methods such as, for example, a distillation.

The reaction of A with B and the reaction of A with B and C can be effected with the aid of the catalysts known for accelerating isocyanate addition reactions, such as, for example, tertiary amines, tin, zinc, iron or bismuth compounds, in particular triethylamine, 1,4-diazabicyclo[2,2,2]octane, bismuth octanoate or dibutyltin dilaurate, which can be initially introduced or metered in later on.

The reaction of A with B is preferably carried out in the presence of stabilizers for acrylates and methacrylates. The compounds described above as stabilizers E are suitable for this purpose. 2,6-Di-tert-butyl-4-methylphenol, phenothiazine and para-methoxyphenol and mixtures thereof are preferred. The addition of the stabilizers can be effected before, during and/or after the reaction.

For the stabilization of the reaction product of the reaction of A with B, which reaction product still contains isocyanate groups, compounds which stabilize the isocyanates from further reactions apart from the desired ones are also suitable. Examples of the latter are in particular acids or acid derivatives, e.g. benzoyl chloride, phthaloyl chloride, phosphinous, phosphonous and/or phosphorous acid, phosphinic, phosphonic and/or phosphoric acid and the acidic esters of the last-mentioned 6 acid types, sulfuric acid and its acidic esters and/or sulfonic acids. The addition of the stabilizers can be effected before, during and/or after the reaction.

The reaction can be carried out in the presence of an organic solvent which is inert to starting materials and products and is preferably also inert to isocyanates. Examples are coating solvents, such as ethyl acetate, butyl acetate, solvent naphtha, methoxypropyl acetate, acetone, butanone or hydrocarbons, such as cyclohexane, methylcyclohexane or isooctane.

After the reaction, the solvent can be removed from the product, for example by distillation, can remain in the product or can be exchanged for another solvent. In a preferred embodiment the solvent is removed by distillation after the reaction. In a further preferred embodiment, a second solvent is added after the reaction and the solvent in which the reaction took place is removed by distillation. The second solvent is preferably a so-called polyol, hydroxy-functional polymer. Suitable polyols are di- or polyols having a number average molecular weight in the range of 500 to 13000 g/mol, preferably 700 to 4000 g/mol. Polymers having an average hydroxyl functionality of 1.5 to 3.5, preferably of 1.8 to 3.2, particularly preferably of 1.9 to 3.1, are preferred. These include, for example, polyester alcohols based on aliphatic, cycloaliphatic and/or aromatic di-, tri- and/or polycarboxylic acids with di-, tri- and/or polyols and polyester alcohols based on lactones. Preferred polyester alcohols are, for example, reaction products of adipic acid with hexanediol, butanediol or neopentylglycol or mixtures of said diols having a molecular weight of 500 to 4000, particularly preferably 650 to 2500. Also suitable are polyetherols, which are obtainable by polymerization of cyclic ethers or by reaction of alkylene oxides with an initiator molecule. The polyethylene and/or polypropylene glycols have an average molecular weight of 500 to 13000, and furthermore polytetrahydrofurans having an average molecular weight of 500 to 8000, preferably of 650 to 3000, may be mentioned by way of example. Also suitable are polyester-polyether-polyester block polyols which can be obtained by reacting polyether polyols with the lactones. Also suitable for hydroxyl-terminated polycarbonates which are obtainable by reacting diols or lactone-modified diols or bisphenols, such as, for example, bisphenol A, with phosgene or carboxylic acid diesters, such as diphenyl carbonate or dimethyl carbonate. The polymeric carbonates of 1,6-hexanediol having an average molecular weight of 500 to 8000 and the carbonates of the reaction products of 1,6-hexanediol with ε-caprolactam in the molar ratio of from 1 to 0.1 may be mentioned by way of example. The abovementioned polycarbonatediols having an average molecular weight of 650 to 3000 and based on 1,6-hexanediol and/or carbonates of the reaction products of 1,6-hexanediol with ε-caprolactam in the molar ratio of from 1 to 0.33 are preferred. Hydroxyl-terminated polyamide alcohols and hydroxyl-terminated polyacrylatediols, e.g. Tegomer® BD) 1000 (from Tego GmbH, Essen, Germany) can likewise be used. Polyols containing ester groups are particularly preferred.

In a further preferred embodiment, a reactive diluent is added after the reaction and the solvent in which the reaction has taken place is then removed by distillation. Such reactive diluents are, for example, the compounds known in the technology of radiation curing (cf. Römpp Lexikon Chemie [Römpp Lexikon Chemistry], page 491, 10th edition, 1998, Georg-Thieme-Verlag, Stuttgart), in particular those having low hydroxyl contents of less than 30, preferably of less than 10 mg KOH/g. The esters of acrylic acid or methacrylic acid may be mentioned by way of example, preferably those of acrylic acid with the following alcohols, monohydric alcohols, such as the isomeric butanols, pentanols, hexanols, heptanols, octanols, nonanols and decanols, and furthermore cycloaliphatic alcohols, such as isobornol, cyclohexanol and alkylated cyclohexanols, dicyclopentanol, arylaliphatic alcohols, such as phenoxyethanol and nonylphenylethanol, and tetrahydrofurfuryl alcohol. It was furthermore possible to use alkoxylated derivatives of these alcohols, dihydric alcohols, such as, for example, ethylene glycol, 1,2-propanediol, 1,3-propanediol, diethylene glycol, dipropylene glycol, the isomeric butanediols, neopentylglycol, 1,6-hexanediol, 2-ethylhexanediol and tripropylene glycol, or alkoxylated derivatives of these alcohols. Preferred dihydric alcohols are 1,6-hexanediol, dipropylene glycol and tripropylene glycol.

Esters of alcohols having a higher functionality, such as glycerol, trimethylolpropane, ditrimethylolpropane, pentaerythritol or dipentaerythritol, and the alkoxylated derivatives thereof can likewise be used. The esters of acrylic acid with trimethylolpropane, pentaerythritol and dipentaerythritol are preferred.

The reaction of A with B or of A with B and C is effected either continuously, for example in a static mixer, or batchwise, for example in a suitable stirred vessel. In the case of the batchwise procedure, both A and B as well as C can be initially introduced and the respective other components metered in at room temperature or elevated temperature. The reaction is preferably effected by initially introducing A and metering in B and C.

The reaction of A with B and C can be effected by mixed addition of the components B and C. The reaction of A with B and C is, however, preferably, effected in such a way that first A is reacted with B, the resulting reaction product accordingly having a content of isocyanate groups of 0.5 to 10% by weight, preferably contains 0.6 to 6% by weight, particularly preferably 0.7 to 4.5% by weight. The reaction product which was obtained by reacting A with B is then effected with C, a urethane acrylate according to the invention being obtained.

With the use of a plurality of components B, these may be reacted either as a mixture with A or in succession analogously to the procedure earlier described for the reaction of A and B and C. With the use of a plurality of components B having different reactivities towards isocyanates, the components B are preferably reacted in succession with A, particularly preferably in the sequence of their reactivity beginning with the component B with the lowest reactivity.

With the use of a plurality of components C, these may be reacted either as a mixture with the reaction product of A and B or in succession analogously to the procedure described for the reaction of A with B and C. With the use of a plurality of components C having different reactivities towards isocyanates, the components C are preferably reacted in succession with the reaction product of A and B, particularly preferably in the sequence of their reactivity beginning with the component C with the lowest reactivity. By heating and/or exothermic reaction, the reaction is preferably kept in the temperature range of 40° C. to 130° C., particularly preferably 50° C. to 80° C. The conversion is determined by analysis. This can be effected spectroscopically, for example by recording infrared or near infrared spectra, but it can also be carried out by chemical analyses of samples taken. For example, the isocyanate content but optionally also the hydroxyl content is particularly suitable as a measure of the conversion of the reaction. The reaction of A with B or A with B and C can optionally be followed by further abovementioned reactions known per se from polyurethane chemistry.

In a preferred embodiment, the amounts of A), B) and optionally C) are such that the reaction product in solvent-free form has a double bond density (acrylate and/or methacryl) of $\geq 0.5$, preferably $\geq 0.8$, mole of C=C per kg (based on nonvolatile fraction).

In the present invention, it has proved to be advantageous if the urethane (meth)acrylates of the invention are based on tris (p-isocyanatophenyl) thiophosphate or triphenyl-methane 4,4',4"-triisocyanate. It is very particularly advantageous if, for the preparation thereof, hydroxyethyl acrylate, hydroxypropyl acrylate or hydroxybutyl acrylate is used as component B) alone or in combination with 9-(2-hydroxyethyl)-9H-carbazole, hydroxymethylnaphthalene, N-(2-hydroxyethyl) phthalimide or naphthalenethiomethanol used as component C).

The invention therefore also relates to urethane (meth) acrylates obtainable by reacting tris(p-isocyanatophenyl) thiophosphate or triphenylmethane 4,4',4"-triisocyanate with isocyanate-reactive compounds having at least one radiation-curable olefinically unsaturated double bond.

Hydroxy ethyl acrylate is preferably used as isocyanate-reactive compounds having at least one radiation-curable olefinically unsaturated double bond.

In addition to the two abovementioned components the components mentioned under C) to E) can also concomitantly be used in the preparation of these urethane (meth)acrylates.

For the production of holographic media from the above-mentioned urethane (meth)acrylates a), an isocyanate component b), an isocyanate-reactive component c) and one or more photoinitiators d) are preferably also used.

The isocyanate component b) preferably comprises polyisocyanates. Polyisocyanates which will be used are all compounds well known per se to the person skilled in the art or mixtures thereof which on average have two or more NCO functions per molecule. These may be aromatic, araliphatic, aliphatic or cycloaliphatic. Monoisocyanates and/or polyisocyanates containing unsaturated groups may also concomitantly be used in minor amounts.

For example, butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate, the isomeric bis(4,4'-isocyanatocyclohexyl)-methanes and mixtures thereof having any desired isomer content, isocyanatomethyl-1,8-octane diisocyanate, 1,4-cyclohexylene diisocyanate, the isomeric cyclohexanedimethylene diisocyanates, 1,4-phenylene diisocyanate, 2,4- and/or 2,6-tolulene diisocyanate, 1,5-naphthylene diisocyanate, 2,4'- or 4,4'-diphenylmethane diisocyanate and/or triphenylmethane 4,4',4"-triisocyanate are suitable.

The use of derivatives of monomeric di- or triisocyanates having urethane, urea, carbodiimide, acylurea, isocyanurate, allophanate, biuret, oxadiazinetrione, uretdione and/or iminooxadiazinedione structures is likewise possible.

The use of polyisocyanates based on aliphatic and/or cycloaliphatic di- or triisocyanates is preferred.

The polyisocyanates of component A) are particularly preferably di- or oligomerized aliphatic and/or cycloaliphatic di- or triisocyanates.

Isocyanurates, uretdiones and/or iminooxadiazinediones based on HDI, 1,8-diisocyanato-4-(isocyanatomethyl)octane or mixtures thereof are very particularly preferred.

The NCO groups of the polyisocyanates of component b) can also be completely or partly blocked with the blocking agents customary per se in industry. These are, for example, alcohols, lactams, oximes, malonic esters, alkyl acetoacetates, triazoles, phenols, imidazoles, pyrazoles and amines, such as, for example, butanone oxime, diisopropylamine, 1,2,4-triazole, dimethyl-1,2,4-triazole, imidazole, diethyl malonate, ethyl acetate, acetone oxime, 3,5-dimethylpyrazole, epsilon-caprolactam, N-tert-butyl-benzylamine, cyclopentanone carboxyethyl ester or any desired mixtures of these blocking agents.

All polyfunctional, isocyanate-reactive compounds which have on average at least 1.5 isocyanate-reactive groups per molecule can be used per se as component c).

Isocyanatereactive groups in the context of the present invention are preferably hydroxyl, amino or thio groups.

Suitable polyfunctional, isocyanate-reactive compounds are, for example, polyesterpolyols, polyetherpolyols, polycarbonatepolyols, poly(meth)acrylatepolyols and/or polyurethanepolyols.

Suitable polyesterpolyols are, for example, linear polyesterdiols or branched polyesterpolyols, as are obtained in a known manner from aliphatic, cycloaliphatic or aromatic di- or polycarboxylic acids or their anhydrides with polyhydric alcohols having an OH functionality of $\geq 2$.

Examples of such di- or polycarboxylic acids or anhydrides are succinic, glutaric, adipic, pimeic, suberic, azelaic, sebacic, nonandicarboxylic, decandicarboxylic, terephthalic, isophthalic, o-phthalic, tetrahydrophthalic, hexahydrophthalic or trimellitic acid and acid anhydrides, such as o-phthalic, trimellitic or succinic anhydride, or any desired mixtures thereof with one another.

Examples of suitable alcohols are ethanediol, di-, tri- and tetraethylene glycol, 1,2-propanediol, di-, tri- and tetrapropylene glycol, 1,3-propanediol, 1,4-butanediol, 1,3-butanediol, 2,3-butanediol, 1,5-pentanediol, 1,6-hexanediol, 2,2-dimethyl-1,3-propanediol, 1,4-dihydroxycyclohexane, 1,4-dimethylolcyclohexane, 1,8-octanediol, 1,10-decanediol, 1,12-dodecanediol, trimethylolpropane, glycerol or any desired mixtures thereof with one another.

The polyesterpolyols may also be based on natural raw materials, such as castor oil. It is also possible for the polyesterpolyols to be based on homo- or copolymers of lactones, as can preferably be obtained by an addition reaction of lactones or lactone mixtures, such as butyrolactone, ε-caprolactone and/or methyl-ε-caprolactone, with hydroxy-functional compounds, such as polyhydric alcohols having an OH functionality of $\geq 2$, for example of the abovementioned type.

Such polyesterpolyols preferably have number average molar masses of 400 to 4000 g/mol, particularly preferably of 500 to 2000 g/mol. Their OTT functionality is preferably 1.5 to 3.5, particularly preferably 1.8 to 3.0.

Suitable polycarbonatepolyols are obtainable in the manner known per se by reacting organic carbonates or phosgene with diols or diol mixtures.

Suitable organic carbonates are dimethyl, diethyl and diphenyl carbonate.

Suitable diols or diol mixtures comprise the polyhydric alcohols mentioned per se in connection with the polyester segments and having an OH functionality of $\geq 2$, preferably 1,4-butanediol, 1,6-hexanediol and/or 3-methylpentanediol.

Such polycarbonatepolyols preferably have number average molar masses of 400 to 4000 g/mol, particularly preferably of 500 to 2000 g/mol. The OH functionality of these polyols is preferably 1.8 to 3.2, particularly preferably 1.9 to 3.0.

Suitable polyetherpolyols are polyadducts of cyclic ethers with OH— or NH-functional initiator molecules, which polyadducts optionally have a block structure.

Suitable cyclic ethers are, for example, styrene oxides, ethylene oxide, propylene oxide, tetrahydrofuran, butylene oxide, epichlorohydrin, and any desired mixtures thereof.

Initiators which may be used are the polyhydric alcohols mentioned in connection with the polyesterpolyols and having an OH functionality of $\geq 2$ and primary or secondary amines and amino alcohols.

Such polyetherpolyols preferably have number average molar masses of 250 to 10 000 g/mol, particularly preferably of 500 to 4000 g/mol and very particularly preferably of 600 to 2000 g/mol. The OH functionality is preferably 15 to 4.0, particularly preferably 1.8 to 3.0.

In addition, aliphatic, araliphatic or cycloaliphatic di-, tri- or polyfunctional alcohols which have a low molecular weight, i.e. having molecular weights of less than 500 g/mol, and are short-chain, i.e. contain 2 to 20 carbon atoms, are also suitable as polyfunctional, isocyanate-reactive compounds as constituents of component G2).

These may be, for example, ethylene glycol, diethylene glycol, triethylene glycol, tetraethylene glycol, dipropylene glycol, tripropylene glycol, 1,2-propanediol, 1,3-propanediol, 1,4-butanediol, neopentylglycol, 2-ethyl-2-butylpropanediol, trimethylpentanediol, diethyloctanediol positional isomers, 1,3-butylene glycol, cyclohexanediol, 1,4-cyclohexanedimethanol, 1,6-hexanediol, 1,2- and 1,4-cyclohexanediol, hydrogenated bisphenol A (2,2-bis(4-hydroxycyclohexyl)propane), 2,2-dimethyl-3-hydroxypropionic acid (2,2-dimethyl-3-hydroxypropylester). Examples of suitable triols are trimethylolethane, trimethylolpropane or glycerol. Suitable alcohols having a higher functionality are ditrimethylolpropane, pentaerythritol, dipentaerythritol or sorbitol.

Amino alcohols, such as, for example, ethanolamine, diethanolamine, 2-(N,N-dimethyl-amino)ethylamine, N-methyldiethanolamine, N-methyldiisopropanol amine, N-ethyldiethanolamine, N-ethyldiisopropanolamine, N,N'-bis(2-hydroxyethyl)perhydropyrazine, N-methylbis(3-aminopropyl)amine, N-methylbis(2-aminoethyl)amine, N,N',N''-trimethyldiethylenetriamine, N,N-dimethylaminoethanol, N,N-diethylaminoethanol, 1-N,N-diethylamino-2-aminoethane, 1-N,N-diethylamino-3-aminopropane, 2-dimethylaminomethyl-2-methyl-1,3-propanediol, N-isopropyldiethanolamine, N-butyldiethanolamine, N-isobutyldiethanolamine, N-oleyl-diethanolamine, N-stearyldiethanolamine, oxethylated coconut fatty amine, N-allyldiethanolamine, N-methyldiisopropanolamine, N,N-propyldiisopropanolamine, N-butyldiisopropanolamine and/or N-cyclohexyldiisopropanolamine.

One or more photoinitiators are used as component d). These are usually initiators which can be activated by actinic radiation and initiate a free radical polymerization of the corresponding polymerizable groups. Photoinitiators are commercially distributed compounds known per se, a distinction being made between monomolecular (type I) and bimolecular (type IT) initiators. (Type I) systems are, for example, aromatic ketone compounds, e.g. benzophenones, in combination with tertiary amines, alkyl-benzophenones, 4,4'-bis (dimethylamino)benzophenone (Michler's ketone), anthrone and halogenated benzophenones or mixtures of said types. The (type II) initiators, such as the benzoin and its derivatives, benzyl ketals, acylphosphine oxides, e.g. 2,4,6-tri methylbenzoyl-diphenylphosphine oxide, bisacylophosphine oxides, phenylglyoxylic acid esters, camphorquinones, α-aminoalkylphenones, α,α-dialkoxyacetophenones, 1-[4-(phenylthio)phenyl]octane-1,2-dione-2-(O-benzoyloxime) and α-hydroxyalkylphenones, are furthermore suitable. The photoinitiator systems described in EP-A 0223587 and consisting of a mixture of an ammonium arylborate and one or more dyes can also be used as a photoinitiator. For example, tetrabutylammonium triphenylhexylborate, tetrabutylammonium tris-(3-fluorophenyl)hexylborate and tetramethylammonium tris-(3-chloro-4-methylphenyl)hexylborate are suitable as ammonium arylborate. Suitable dyes are, for example, new methylene blue, thionine, basic yellow, pinacynol chloride, rhodamine 6G, gallocyanine, ethyl violet, Victoria blue R, Celestine blue, quinaldine red, crystal violet, brilliant green, Astrazon Orange G, Darrow Red, pyronine Y, basic red 29, pyrillium I, cyanine and methylene blue, azur A.

It may also be advantageous to use mixtures of these compounds. Depending on the radiation source used for curing, type and concentration must be adapted to the photoinitiator in a manner known to the person skilled in the art. Further details are described, for example, in P. K. T. Oldring (Ed.), Chemistry & Technology of UV & EB Formulations For Coatings, Inks & Paints, Vol. 3, 1991, SITA Technology, London, pages 61-328.

Preferred photoinitiators d) are 2,4,6-trimethylbenzoyl-diphenylphosphine oxide, 1-[4-(phenylthio)phenyl]octane-1,2-dione-2-(O-benzoyloxime) and mixtures of tetrabutylammonium tris-(3-fluorophenyl)hexylborate, tetramethylammonium tris-(3-chloro-4-methylphenyl)hexylborate with the dyes, such as, for example, methylene blue, new methylene blue, azur A, pyrillium 1, cyanine, gallocyanine, brilliant green, crystal violet and thionine.

In addition to the components a) to d), it is also possible to use free radical stabilizers, catalysts and further additives.

Suitable free radical stabilizers are inhibitors and antioxidants, as described in "Methoden der organischen Chemie [Methods of Organic Chemistry]" (Houben-Weyl), 4th edition, volume XIV/1, page 433 et seq., Georg Thieme Verlag, Stuttgart 1961. Suitable classes of substances are, for example, phenols, such as, for example, 2,6-di-tert-butyl-4-methylphenol, cresols, hydroquinones, benzyl alcohols, such as, for example, benzhydrol, and optionally also quinones, such as, for example, 2.5-di-tert-butylquinone, and optionally also aromatic amines, such as diisopropylamine or phenothiazine.

Preferred free radical stabilizers are 2,6-di-tert-butyl-4-methylphenol, phenothiazine and benzhydrol.

Furthermore, one or catalysts may be used. These preferably catalyze the urethane formation. Amines and metal compounds of the metals tin, zinc, iron, bismuth, molybdenum, cobalt, calcium, magnesium and zirconium are preferably suitable for this purpose. Tin octanoate, zinc octanoate, dibutyltin dilaurate, dimethyltin dicarboxylate, iron(III) acetylacetonate, iron(II) chloride, zinc chloride, tetraalkylammonium hydroxides, alkali metal hydroxides, alkali metal alcoholates, alkali metal salts of long-chain fatty acids having 10 to 20 carbon atoms and optionally OH side groups, lead octoate or tertiary amines, such as triethylamine, tributylamine, dimethylbenzylamine, dicyclohexylmethylamine, dimethylcyclohexylamine, N,N,N',N'-tetramethyldiaminodiethyl ether, bis(dimethylaminopropyl)urea, N-methyl- or N-ethylmorpholine, N,N'-dimorpholinodiethyl ether (PMDEE), N-cyclohexylmorpholine, N,N,N',N'-tetramethylethylenediamine, N,N,N',N'-tetramethylbutanediamine, N,N,N',N'-tetramethyl-1,6-hexanediamine, pentamethyldiethylenetriamine, dimethylpiperazine, N-dimethylaminoethylpiperidine, 1,2-dimethyimidazole, N-hydroxypropylimidazole, 1-azabicyclo[2.2.0]octane, 1,4-diazabicyclo[2.2.2]octane (DABCO) or a alkanolamine compounds, such as triethanolamine, triisopropanolamine, N-methyl- and N-ethyl-diethanolamine, dimethylaminoethanol, 2-(N,N-dimethylaminoethoxy)ethanol, or N-tris(dialkylaminoalkyl)hexahydrotriazines, e.g. N,N',N-tris(dimethylaminopropyl)-s-hexahydrotriazine, 1,4-diazabicyclo[2.2.2]octane, diazabicyclononane, diazabicycloundecane, 1,1,3,3-tetramethylguanidine, 1,3,4,6,7,8-hexahydro-1-methyl-2H-pyrimido[1,2-a]pyrimidine, are preferred for this purpose.

Particularly preferred catalysts are dibutyltin dilaurate, dimethyltin dicarboxylate, iron(III) acetylacetonate, 1,4-diazabicyclo[2.2.2]octane, diazabicyclononane, diazabicycloundecane, 1,1,3,3-tetramethylguanidine, 1,3,4,6,7,8-hexahydro-1-methyl-2,1-pyrimido(1,2-a)pyrimidine.

For example, solvents, plasticizers, leveling agents, antifoams or adhesive promoters may be present as further auxiliaries and additives, but also polyurethanes, thermoplastic polymers, oligomers and further compounds having functional groups, such as, for example, acetals, epoxide, oxetanes, oxazolines, dioxolanes and/or hydrophilic groups, such as, for example, salts and/or polyethylene oxides.

Preferably used solvents are readily volatile solvents having good compatibility with the 2-component formulations according to the invention, for example ethyl acetate, butyl acetate or acetone.

Preferably used plasticizers are liquids having good dissolution properties, low volatility and a high boiling point; for example, these may be diisobutyl adipate, di-n-butyl adipate, dibutyl phthalate, non-hydroxy-functional polyethers, such as, for example polyethylene glycol dimethyl ether having a number average molar mass of 250 g/mol to 2000 g/mol or polypropylene glycol or mixtures of said compounds.

It may also be advantageous simultaneously to use a plurality of additives of one type. Of course, it may also be advantageous to use a plurality of additives of a plurality of types.

With the production of the holographic media, a mixture of
0.1 to 75% by weight of urethane acrylate component a)
24.999 to 99.899% by weight of isocyanate-reactive component c),
0.001 to 5% by weight of photoinitiators d),
0 to 3% by weight of free radical stabilizers
0 to 4% by weight of catalysts
0 to 50% by weight of auxiliaries and additives
is preferably used for the reaction with the polyisocyanate component b).

A mixture of
2-13% by weight of urethane acrylate component a),
86.998-97.998% by weight of isocyanate-reactive component c),
0.001-1% by weight of photoinitiators d),
0.001-1% by weight of free radical stabilizers,
0-2% by weight of catalysts,
0-15% by weight of auxiliaries and additives
is particularly preferably used.

In another likewise preferred embodiment, a mixture of
12.5-55% by weight of urethane acrylate component a),
44.8-87.8% by weight of isocyanate-reactive component c),
0.1-3% by weight of B3 photoinitiators d),
0.1-3% by weight of radical stabilizers
0-3% by weight of catalysts,
0-50% by weight of auxiliaries and additives
is used.

The molar ratio of NCO to OH in the production of the holographic media of the abovementioned preferred embodiment is typically 0.5 to 2.0, preferably 0.90 to 1.25.

The holographic media are usually obtained by first mixing of all components G1) to G6) with one another. This can be achieved with all methods and apparatuses known per se to the person skilled in the art from mixing technology, such as, for example, stirred vessels or both dynamic and static mixers. The temperatures are 0 to 100° C., preferably 10 to 80° C., particularly preferably 20 to 60° C. This mixture can immediately be further processed or can be stored as an intermediate having a long shelf life, optionally over several months.

If necessary, degassing in a vacuum of, for example, 1 mbar can also be carried out.

Shortly before application, the mixing with polyisocyanate component b) is then effected, it also being possible to use the customary mixing techniques. However, apparatuses without dead spaces or with only small dead spaces are preferred. Methods in which the mixing is effected within a very short time and with very vigorous mixing of the two components mixed are furthermore preferred. Dynamic mixers are particularly suitable for this purpose, especially those in which the components come into contact with another only in the mixer. This mixing can be effected at temperatures of 0 to 80° C., preferably at 5 to 50° C., particularly preferably at 10 to 40° C. The mixture of the two components A and B can optionally also be degassed after the mixing in a vacuum of, for example, 1 mbar in order to remove residual gases and to prevent formation of bubbles in the coating. After the mixing, a clear, liquid formulation is obtained, which, depending on composition, cures at room temperature within a few seconds to a few hours.

The polyurethane systems are preferably adjusted so that the curing occurs at room temperature within minutes to an hour. In a preferred embodiment, the curing is accelerated by heating the formulation after the mixing to temperatures between 30 and 180° C., preferably 40 to 120° C., particularly preferably 50 to 100° C.

Immediately after mixing of all components, the polyurethane systems have viscosities at room temperatures of, typically, 10 to 100 000 mPas, preferably 100 to 20 000 mPas, particularly preferably 200 to 10 000 mPas, especially preferably 500 to 1500 mPas, so that they possess very good processing properties in solvent-free form. In solution in suitable solvents, viscosities at room temperature below 10 000 mPas, preferably below 2000 mPas, particularly preferably below 500 mPas, can be established.

Systems which cure in less than 4 hours and in an amount of 15 g and with a catalyst content of 0.004% or cure in less than 10 minutes in the case of the catalyst content of 0.02% have proved to be advantageous.

According to a preferred process, the formulation described is applied to a substrate directly after mixing, it being possible to use all customary methods known to the person skilled in the art in coating technology; in particular, the coating can be applied by knife coating, casting, printing, screenprinting, spraying or inkjet printing.

The substrates may be plastic, metal, wood, paper, glass, ceramic and composite materials comprising a plurality of these materials, the substrate having the form of a sheet in a preferred embodiment.

In a preferred embodiment, the coating of the substrate with the formulation is carried out in a continuous process. As a rule, the formulation according to the invention is applied to the substrate as a film having a thickness of 5 mm to 1 µm, preferably 500 µm to 5 µm, particularly preferably 50 µm to 8 µm and very particularly preferably 25 µm to 10 µm.

In the case of a sheet as the substrate, flexible, coated sheets which, in the case of a continuous method, can be rolled up after curing and can be stored in this manner over several months are obtained.

In a further preferred embodiment, the formulation is applied so that it is covered on both sides by a transparent substrate, in particular plastic or glass, for this purpose the formulation being poured between the substrates kept at an exact distance of 1 to 2 mm, preferably 1.2 to 1.8 mm, particularly preferably 1.4 to 1.6 mm, in particular 1,5 mm, and the substrates being kept at the exact distance until the formulation has completely solidified and can no longer flow.

The materials used as the substrate can of course also have a plurality of layers. It is possible that the substrate consists of layers of a plurality of different materials and that, for example, it also has coatings with additional properties, such as improved adhesion, greater water repellency or hydrophilization, improved scratch resistance, antireflection properties in certain wavelength ranges, improved evenness of the surface, etc.

The materials obtained by one of the methods described can then be used for the recording of holograms. For this purpose, two light beams are caused to interfere in the material by a method known to the person skilled in the art in holography (P. Hariharan, Optical Holography 2nd Edition, Cambridge University Press, 1996), so that a hologram results. The exposure of the hologram can be effected both with continuous and with pulsed irradiation. Optionally, more than one hologram can also be exposed in the same material and at the same point, it being possible to use, for example, the angle multiplexing method known to the person skilled in the art in holography. After the exposure of the hologram, the material can optionally also be exposed to a strong, broadband light source and the hologram then used without further necessary processing steps. The hologram can optionally also be further processed by further processing steps, for example transferred to another substrate, deformed, insert-molded, adhesively bonded to another surface or covered with scratch-resistant coating.

The holograms produced by one of the processes described can serve for data storage, to the representation of images which serve, for example, for the three-dimensional representation of persons or objects and for the authentification of a person or an article and can be used for the production of an optical element having the function of a lens, a mirror, a filter, a diffusion screen, a diffraction element, an optical waveguide and/or a mask.

EXAMPLES

Unless noted otherwise, all stated percentages are based on percent by weight.

The refractive index was measured at a wavelength of 532 nm. Depending on the wavelength of the samples, the refractive index n was obtained from the transmission and reflection spectra. For this purpose, about 100-300 nm thick films of the samples were applied to quartz glass supports from dilute solution in butyl acetate by spin coating. The transmission and reflection spectrum of this layer packet was measured with a spectrometer from STEAG ETA-Optik, CD-measurement system ETA-RT, and the layer thickness and the spectral curve of n were adapted to the measured transmission and the reflection spectra. This is effected using the internal software of the spectrometer and additionally requires the n data of the quartz glass substrate which were determined before and in a blank measurement.

Example 1

0.1 g of 2,6-di-tert-butyl-4-methylphenol, and 213.07 g of a 27% strength solution of tris(p-isocyanatophenyl) thiophosphate in ethyl acetate (Desmodure RFE, product of Bayer MaterialScience AG, Leverkusen, Germany) were initially introduced into a 500 ml round-bottomed flask and heated to 60° C. Thereafter, 42.37 g of 2-hydroxyethyl acrylate were added dropwise and the mixture was further kept at 60° C. until the isocyanate content had fallen below 0.1%. Thereafter, cooling was effected and the ethyl acetate was completely removed in vacuo. The product was obtained as a semicrystalline solid.

Example 2

0.05 g of 2,6-di-tert-butyl-4-methylphenol, 0.015 g of dibutyltin dilaurate and 98.88 g of a 27% strength solution of tris(p-isocyanatophenyl) thiophosphate in ethyl acetate (Desmodur® RIFE, product of Bayer MaterialScience AG, Leverkusen, Germany) were initially introduced into a 250 ml round-bottomed flask and heated to 60° C. Thereafter, 9.83 g of 2-hydroxyethyl acrylate were added dropwise and the mixture was further kept at 60° C. until the isocyanate content had fallen below 3.3%. Thereafter, 13.41 g of 2-naphthalenemethanol were added dropwise and 60° C. was further maintained until the isocyanate content had fallen below 0.1%. Thereafter, cooling was effected and the ethyl acetate was completely removed in vacuo. The product was obtained as a semicrystalline solid.

Example 3

0.15 g of 2,6-di-tert-butyl-4-methylphenol, 257.47 g of a 27% strength solution of tris(p-isocyanatophenyl)thiophosphate in ethyl acetate (Desmodur® RFE, product of Bayer MaterialScience AG, Leverkusen, Germany) were initially introduced into a 500 ml round-bottomed flask and heated to 60° C. Thereafter, 34.30 g of 2-hydroxyethyl acrylate were added dropwise and the mixture was further kept at 60° C. until the isocyanate content had fallen below 2.1%. Thereafter, 46.03 g of 4,4-isopropylidenebis[2-(2,6-dibromophenoxy)ethanol] were added dropwise and 60° C. was further maintained until the isocyanate content had fallen below 0.1%. Thereafter, cooling was effected and the ethyl acetate was completely removed in vacuo. The product was obtained as a semicrystalline solid.

Example 4

0.03 g of 2,6-di-tert-butyl-4-methylphenol, 0.01 g of dibutyltin dilaurate and 150.34 g of a 27% strength solution of tris(p-isocyanatophenyl) thiophosphate in ethyl acetate (Desmodur® RFE, product of Bayer MaterialScience AG, Leverkusen, Germany) were initially introduced into a 250 ml round-bottomed flask and heated to 60° C. Thereafter, 14.95 g of 2-hydroxyethyl acrylate were added dropwise and the mixture was further kept at 60° C. until the isocyanate content had fallen below 3.3%. Thereafter, 44.33 g of poly(F-caprolactone) monoacrylate (Tone M100, product of Dow Chemicals Inc.) were added dropwise and 60° C. was further maintained until the isocyanate content had fallen below 0.1%. Thereafter, cooling was effected and the ethyl acetate was completely removed in vacuo. The product was obtained as a viscous liquid.

Example 5

0.05 g of 2,6-di-tert-butyl-4-methylphenol, 0.015 g of dibutyltin ditaurate and 90.71 g of a 27% strength solution of tris(p-isocyanatophenyl) thiophosphate in ethyl acetate (Desmodurg RIE, product of Bayer MaterialScience AG, Leverkusen, Germany) were initially introduced into a 250 ml round-bottomed flask and heated to 60° C. Thereafter, 9.02 g of 2-hydroxyethyl acrylate were added dropwise and the mixture was further kept at 60° C. until the isocyanate content had fallen below 3.3%. Thereafter, 16.43 g of 9H-carbazolyl-9-ethanol were added dropwise and 60° C. was further maintained until the isocyanate content had fallen below 0.1%. Thereafter, cooling was effected and the ethyl acetate was completely removed in vacuo. The product was obtained as a semicrystalline solid.

Example 6

0.15 g of 2,6-di-tert-butyl-4-methylphenol, 0.15 g of dibutyltin dilaurate and 356.19 g of a 27% strength solution of tris(p-isocyanatophenyl) thiophosphate in ethyl acetate (Desmodur® RFE, product of Bayer MaterialScience AG, Leverkusen, Germany) were initially introduced into a 500 ml round-bottomed flask and heated to 60° C. Thereafter, 47.22 g of 2-hydroxyethyl acrylate were added dropwise and the mixture was further kept at 60° C. until the isocyanate content had fallen below 2.1%. Thereafter, 6.31 g of 1,2-ethanediol were added dropwise and 60° C. was further maintained until the isocyanate content had fallen below 0.1%. Thereafter, cooling was effected and the ethyl acetate was completely removed in vacuo. The product was obtained as a semicrystalline solid.

Example 7

0.15 g of 2,6-di-tert-butyl-4-methylphenol, 0.15 g of dibutyltin dilaurate and 349.69 g of a 27% strength solution of tris(p-isocyanatophenyl) thiophosphate in ethyl acetate (Desmodur® RFE, product of Bayer MaterialScience AG, Leverkusen, Germany) were initially introduced into a 500 ml round-bottomed flask and heated to 60° C. Thereafter, 46.36 g of 2-hydroxyethyl acrylate were added dropwise and the mixture was further kept at 60° C. until the isocyanate content had fallen below 2.1%. Thereafter, 8.93 g of trimethylolpropane were added dropwise and 60° C. was further maintained until the isocyanate content had fallen below 0.1%. Thereafter, cooling was effected and the ethyl acetate was completely removed in vacuo. The product was obtained as a semicrystalline solid.

Example 8

0.05 g of 2,6-di-tert-butyl-4-methylphenol, 0.015 g of dibutyltin dilaurate and 76.71 g of a 27% strength solution of tris(p-isocyanatophenyl) thiophosphate in ethyl acetate (Desmodur® RFE, product of Bayer MaterialScience AG, Leverkusen, Germany) were initially introduced into a 250 ml round-bottomed flask and heated to 60° C. Thereafter, 29.22 g of 2-hydroxy-3-phenoxypropyl acrylate were added dropwise and 60° C. was further maintained until the isocyanate content had fallen below 0.1%. Thereafter, cooling was effected and the ethyl acetate was completely removed in vacuo. The product was obtained as a semicrystalline solid.

Example 9

0.06 g of 2,6-di-tert-butyl-4-methylphenol, 0.02 g of dibutyltin dilaurate and 127.80 g of a 27% strength solution of tris(p-isocyanatophenyl) thiophosphate in ethyl acetate (Desmodur® RFE, product of Bayer MaterialScience AG, Leverkusen, Germany) was initially introduced into a 250 ml round-bottomed flask and heated to 60° C. Thereafter, 25.41 g of 2-hydroxyethyl acrylate were added dropwise and the mixture was further kept at 60° C. until the isocyanate content had fallen below 0.1%. Thereafter, cooling was effected, 40 g of the polyol containing ester groups were added and the ethyl acetate was completely removed in vacuo. The product was obtained as a clear solution.

Example 10

0.05 g 2,6-di-tert-butyl-4-methylphenol, 0.015 g of dibutyltin dilaurate and 82.35 g of a 27% strength solution of tris(p-isocyanatophenyl) thiophosphate in ethyl acetate (Desmodur® RFE, product of Bayer MaterialScience AG, Leverkusen, Germany) were initially introduced into a 250 ml round-bottomed flask and heated to 60° C. Thereafter, 5.46 g of 2-hydroxyethyl acrylate were added dropwise and the mixture was further kept at 60° C. until the isocyanate content had fallen below 4.5%. Thereafter, 7.37 g of 2-(para-chlorophenyl)ethanol were added dropwise and the mixture was further kept at 60° C. until the isocyanate content had fallen below 2.1%. Thereafter, 14.87 g of 4,4-isopropylidenebis[2-2,6-dibromophenoxy)ethanol] were added dropwise and 6000 was further maintained until the isocyanate content had fallen below 0.1%. Thereafter, cooling was effected and the ethyl acetate was completely removed in vacuo. The product was obtained as a semicrystalline solid.

Example 11

0.01 g of 2,6-di-tert-butyl-4-methylphenol, 0.004 g of dibutyltin dilaurate and 28.88 g of a 27% strength solution of tris(p-isocyanatophenyl) thiophosphate in ethyl acetate (Desmodur® RFE, product of Bayer MaterialScience AG, Leverkusen, Germany) were initially introduced into a 50 ml round-bottomed flask and heated to 60° C. Thereafter, 2.87 g of 2-hydroxyethyl acrylate were added dropwise and the mixture was further kept at 60° C. until the isocyanate content had fallen below 3.3%. Thereafter, 4.31 g of 2-naphthalenemethanethiol were added dropwise and 60° C. was further maintained until the isocyanate content had fallen below 0.1%. Thereafter, cooling was effected and the ethyl acetate was completely removed in vacuo. The product was obtained as a semicrystalline solid.

Example 12

0.25 g of 2,6-ditert-butyl-4-methylphenol, and 135.97 g of 4,4'-diphenylmethane diisocyanate were initially introduced into a 500 ml round-bottomed flask and heated to 60° C. Thereafter, 12.84 g of 3-methylpentanediol were added dropwise and the mixture was further kept at 60° C. until the isocyanate content had fallen below 24.5%. Thereafter, 100.94 g of 2-hydroxyethyl acrylate were added dropwise and 60° C. was further maintained until the isocyanate content had fallen below 0.1%. Thereafter, cooling was effected and the product was obtained as a semicrystalline solid.

Example 13

0.15 g of 2,6-di-tert-butyl-4-methylphenol, and 95.41 g of 2-isocyanato-1,3-diisopropylbenzene were initially introduced into a 250 ml round-bottomed flask and heated to 60° C. Thereafter, 54.44 g of 2-hydroxyethyl acrylate were added dropwise and 60° C. was maintained until the isocyanate content had fallen below 0.1%. Thereafter, cooling was effected and the product was obtained as a semicrystalline solid.

Example 14

0.1 g of 2,6-di-tert-butyl-4-methylphenol, 0.05 g of dibutyltin dilaurate and 189.52 g of a 27% strength solution of triphenylmethane 4,4',4"-triisocyanate in ethyl acetate (Desmodur® RE, product of Bayer MaterialScience AG, Leverkusen, Germany) were initially introduced into a 500 ml round-bottomed flask and heated to 65° C. Thereafter, 48.68 g of 2-hydroxyethyl acrylate were added dropwise and the mixture was further kept at 65° C. until the isocyanate content had fallen below 0.1%. Thereafter, cooling was effected and the ethyl acetate was completely removed in vacuo. The product was obtained as a semicrystalline solid.

Example 15

0.10 g of 2,6-di-tert-butyl-4-methylphenol, 0.05 g of dibutyltin dilaurate and 213.68 g of a 27% strength solution of tris(p-isocyanatophenyl) thiophosphate in ethyl acetate (Desmodur® RFE, product of Bayer MaterialScience AG, Leverkusen, Germany) were initially introduced into a 500 ml round-bottomed flask and heated to 65° C. Thereafter, 21.25 g of 2-hydroxyethyl acrylate were added dropwise and the mixture was further kept at 65° C. until the isocyanate content had fallen below 3.3%. Thereafter, 20.91 g of 2-thiophenemethanol were added dropwise and 65° C. was further maintained until the isocyanate content had fallen below 0.1%. Thereafter, cooling was effected and the ethyl acetate was completely removed in vacuo. The product was obtained as a semicrystalline solid.

Example 16

0.10 g of 2,6-di-tert-butyl-4-methylphenol, 0.05 g of dibutyltin dilaurate and 223.31 g of a 27% strength solution of tris(p-isocyanatophenyl) thiophosphate in ethyl acetate (Desmodur® RYE, product of Bayer MaterialScience AG, Leverkusen, Germany) were initially introduced into a 500 ml round-bottomed flask and heated to 65° C. Thereafter, 34.16 g of 2-hydroxyethyl acrylate were added dropwise and the mixture was further kept at 65° C. until the isocyanate content had fallen below 1.4%. Thereafter, 5.40 g of 2,2'-thiodiethanol were added dropwise and 65° C. was further maintained until the isocyanate content had fallen below 0.1%. Thereafter, cooling was effected and the ethyl acetate was completely removed in vacuo. The product was obtained as a semicrystalline solid.

Comparative Example 1

Desmolux VP LS 2308 (urethane acrylate based on a low-viscosity hexane diisocyanate trimer and hydroxyalkyl acrylates, dissolved in 20% of hexanediol diacrylate, experimental product of Bayer MateriaiScience AG, Leverkusen, Germany)

| Example | Refractive index at $\lambda = 532$ nm | Double bond density eq/kg (FH) |
|---|---|---|
| 1 | 1.584 | 3.65 |
| 2 | 1.629 | 1.70 |
| 3 | 1.606 | 1.97 |
| 4 | 1.550 | 2.58 |
| 5 | 1.637 | 1.55 |
| 6 | 1.595 | 2.71 |
| 7 | 1.590 | 2.66 |
| 8 | 1.596 | 2.63 |
| 9 | 1.584 | 3.65 |
| 10 | 1.618 | 0.94 |
| 11 | 1.650 | 1.65 |
| 12 | 1.550 | 3.48 |
| 13 | 1.514 | 3.13 |
| 14 | 1.594 | 4.20 |
| 15 | 1.610 | 1.83 |
| 16 | 1.592 | 2.94 |
| Comparison 1 Desmolux ® VP LS 2308 | 1.496 | 2.80 |

For testing the optical properties, media were produced and optically measured as described below:
Preparation of the Polyol Component:

0.18 g of zinc octoate, 374.81 g of c-caprolactone and 374.81 g of a difunctional polytetrahydrofuran polyether polyol (equivalent weight 500 g/mol OH) were initially introduced into a 1 l flask and heated to 120° C. and kept at this temperature until the solids content (proportion of nonvolatile constituents) was 99.5% by weight or more. Thereafter, cooling was effected and the product was obtained as a waxy solid.

Medium 1:

7.913 g of the polyol component prepared as described above were mixed with 0.500 g of urethane acrylate from Example 1, 0.015 g of Darocur TPO 2,4,6-Trimethylbenzoyl-diphenyl-phosphinoxid (commercial product from Ciba Specialty Chemicals, Basle, Switzerland) and 0.050 g of benzhydrol at 50° C. so that a clear solution was obtained. Thereafter, cooling to 30° C. was effected, 1.522 g of Desmodur® XP 2410 (experimental product of Bayer MaterialScience AG, Leverkusen, Germany, hexane diisocyanate-based polyisocyanate, proportion of iminooxadiazindione at least 30%, NCO content: 23.5%) were added and mixing was effected again. Finally, 0.004 g of Fomrez UL 28 (urethanization catalyst, commercial product from GE Silicones, Wilton, Conn., USA) was added and mixing was effected again briefly. The liquid material obtained was then poured onto a glass plate and covered there with a second glass plate which was kept at a distance of 250 μm by spacers which were laid out. This test specimen was first left for 30 minutes at room temperature and then cured for two hours at 50° C.

Medium 2:

7.982 g of the polyol component prepared as described above were mixed with 0.500 g of urethane acrylate from Example 5, 0.015 g of Darocur TPO 2,4,6-Trimethylbenzoyl-diphenyl-phosphinoxid (commercial product from Ciba Specialty Chemicals, Basle, Switzerland) and 0.050 g of benzhydrol at 50° C. so that a clear solution was obtained. Thereafter, cooling to 30° C. was effected, 1.453 g of Desmodur® XP 2410 (experimental product of Bayer MaterialScience AG, Leverkusen, Germany, hexane diisocyanate-based polyisocyanate, proportion of iminooxadiazindione at least 30%, NCO content: 23.5%) were added and mixing was effected again. Finally, 0.004 g of Fomrez UL 28 (urethanization catalyst, commercial product from GE Silicones, Wilton, Conn., USA) was added and mixing was effected again briefly. The liquid material obtained was then poured onto a glass plate and covered there with a second glass plate which was kept at a distance of 250 μm by spacers which were laid out. This test specimen was first left for 30 minutes at room temperature and then cured for two hours at 50° C.

Medium 3:

7.982 g of the polyol component prepared as described above were mixed with 0.500 g of urethane acrylate from Example 14, 0.015 g of Darocur TPO 2,4,6-Trimethylbenzoyl-diphenyl-phosphinoxid (commercial product from Ciba Specialty Chemicals, Basle, Switzerland) and 0.050 g of benzhydrol at 50° C. so that a clear solution was obtained. Thereafter, cooling to 30° C. was effected, 1.453 g of Desmodur® XP 2410 (experimental product of Bayer MaterialScience AG, Leverkusen, Germany, hexane diisocyanate-based polyisocyanate, proportion of iminooxadiazindione at least 30%, NCO content: 23.5%) were added and mixing was effected again. Finally, 0.004 g of Fomrez UL 28 (urethanization catalyst, commercial product from GE Silicones, Wilton, Conn., USA) was added and mixing was effected again briefly. The liquid material obtained was then poured onto a glass plate and covered there with a second glass plate which was kept at a distance of 250 μm by spacers which were laid out. This test specimen was first left for 30 minutes at room temperature and then cured for two hours at 50° C.

Comparative Medium:

7.913 g of the polyol component prepared as described above were mixed with 0.500 g of Desmolux VP LS 2308 (experimental product from Bayer MaterialScience AG, Leverkusen, Germany, based on hexane diisocyanate polyisocyanate, refractive index (532 nm)-1.496), 0.015 g of Darocur TPO 2,4,6-Trimethylbenzoyl-diphenyl-phosphinoxid (commercial product from Ciba Specialty Chemicals, Basle, Switzerland) and 0.050 g of benzhydrol at 50° C. so that a clear solution was obtained. Thereafter, cooling to 30° C. was effected, 1.522 g of Desmodur® XP 2410 (experimental product of Bayer MaterialScience AG, Leverkusen, Germany, hexane diisocyanate-based polyisocyanate, proportion of iminooxadiazindione at least 30%, NCO content: 23.5%) were added and mixing was effected again. Finally, 0.004 g of Fomrez UL 28 (urethanization catalyst, commercial product from GE Silicones, Wilton, Conn., USA) was added and mixing was effected again briefly. The liquid material obtained was then poured onto a glass plate and covered there with a second glass plate which was kept at a distance of 250 μm by spacers which were laid out. This test specimen was first left for 30 minutes at room temperature and then cured for two hours at 50° C.

The media produced as described were then tested as follows for their holographic properties:

FIG. 1 shows the holographic test setup with which the dynamic range, the so-called M#, of the media was measured.

The elliptical beam cross section of a laser beam of a GaN laser diode (emission wavelength 405 nm) was made circular with the aid of the anamorphous prism pair AP. The laser diode has an external resonator for generating a sufficiently large coherence length. The spatial filter (R) together with the collimation lens (L) generates a parallel homogeneous beam whose cross section was established with the iris diaphragm (II). The polarization-dependent beam splitters (P1 and P2) split the laser beam into two coherent equally polarized beams. The powers of the two beams were adjusted to 1 mW by means of the $\lambda/2$ plates (W1 and W2). The powers were determined with the aid of the semiconductor detectors (D1 and D2) with the sample removed. The iris diaphragms (I3 and I4) were adjusted to a diameter of 4 mm. The half-angle ($\theta$) was 21.72°. At the position of the sample (medium), the interference field of the two overlapping beams produced a lattice of bright and dark strips which were parallel to the angle bisectors of the two beams incident on the sample. The strips spacing in the medium was 550 nm (refractive index of the medium assumed to be ~1.49).

61 holograms were written into the medium at different angles (W) of rotation of the turntable (DT) in the following manner:

Shutter 2 (S2) was always open.

$\Omega$ was set to −30°. Shutter 1 (S1) was opened for the time t1.

$\Omega$ was set at −29'. Shutter 1 (S1) was opened for the time t2.

$\Omega$ was set at +301. Shutter 1 (S1) was opened for the time t61.

Thereafter, with closed shutters (S1 and S2), the medium was allowed a time of 5 minutes for the diffusion of the still unpolymerized writing monomers.

The holograms written were now read in the following manner. The shutter 2 (S2) remained closed. The shutter 1 (81) was opened. The iris diaphragm (12) was closed to a diameter of <1 mm. This ensured that the beam always lay completely in the hologram written beforehand for all angles ($\Omega$) of rotation. The turntable now covered the angular range of $\Omega$=−32° to $\Omega$=32° with an angular step width of 0.02° under computer control. At each angle $\Omega$ reached, the powers of the beam transmitted in the zero order were measured by means of the detector D1 and the powers of the beam diffracted in the first order were measured by means of the detector D2. At each angle W reached, the diffraction efficiency was obtained as the quotient of:

power in D2/(power in D2+power in D1)

On plotting the diffraction efficiency against Ω, the reconstructed holograms were recovered as peaks in this diagram. Let the maximum diffraction efficiency of the i th hologram, i.e. its peak value, be $\epsilon_i$. The dynamic range M# was thus found to be:

$$M\# = (\epsilon_1)^{0.5} + (\epsilon_2)^{0.5} \ldots (\epsilon_{61})^{0.5}. \quad (1)$$

The writing times $t_i$ of the individual hologram had to be chosen by successive optimization so that the following further conditions for a valid M# were fulfilled, All $\epsilon_i$ had to be <0.1 and the partial sums $M\#_j = (\epsilon_1)^{0.5} + (\epsilon_2)^{0.5} \ldots (\epsilon_j)^{0.5}$ plotted against the writing times $t_i$ of the holograms 1, 2 to j had to tend to a saturation value as j tended to 61. This saturation value was then the valid M# according to the above formula (1).

With 61 holograms, the maximum M# of 19.28 was to be determined under the given boundary conditions. If the dynamic range of a medium were to have been larger, it would have been possible to increase the number of holograms. At the same time, the angle increment between two successively written holograms would have had to be reduced from 1° to the correspondingly smaller value.

M# is linearly proportional to the thickness of the medium. The thickness of the media in the abovementioned examples was 250 μm, owing to the spacers used in the production of the media. To ensure comparability with media having another thickness d, M# was scaled to a medium thickness of 200 μm by means of the following formula.

$$M\#/200 \ \mu m = M\# \ 200 \ \mu m/d.$$

If a medium was very thin, so that 61 holograms could not have been written and read separately from one another, the number of holograms could be reduced. At the same time, the angle increment between two successfully written holograms had to be increased from 1° to the correspondingly larger value.

The following measured values were obtained for M#/200 μm:

| Example | Dynamic range (M#/200 μm) |
|---|---|
| Medium 1 | 6.73 |
| Medium 2 | 6.98 |
| Medium 3 | 7.33 |
| Comparative medium | 2.09 |

The values found for the dynamic range show that the urethane acrylate used in the comparative medium and having a refractive index of <1.5 is scarcely suitable for use in holographic media, whereas the urethane acrylates in the media 1 to 3, having refractive indices of >1.5, are very suitable for the production of holographic media.

All the references described above are incorporated by reference in its entirety for all useful purposes.

While there is shown and described certain specific structures embodying the invention, it will be manifest to those skilled in the art that various modifications and rearrangements of the parts may be made without departing from the spirit and scope of the underlying inventive concept and that the same is not limited to the particular forms herein shown and described.

What is claimed is:

1. A process for preparing olefinically unsaturated aromatic urethanes, the process comprising the step of
   A) reacting one or more aromatic polyisocyanates with
   B) one or more isocyanate-reactive compounds having at least one radiation-curable olefinically unsaturated double bond,
   C) one or more isocyanate-reactive compounds which contain no radiation-curable olefinically unsaturated double bonds,
   D) optionally one or more nanoparticulate fillers and
   E) optionall y one or more stabilizers, wherein the olefinically unsaturated aromatic urethanes have a refractive index at λ=532 nm of ≧1.5, and wherein the one or more isocyanate-reactive compounds in C) are selected from the group consisting of 9-(2-hydroxyethyl)-9H-carbazole, hydroxymethylnaphthalene, N-(2-hydroxyethyl)phthalimide, 2-phenylethanol,(p-chloro)phenylethanol, 2-(p-chlorophenyl)ethanol, triphenylmethanol, naphthalenethiomethanol, and mixtures thereof.

2. Process according to claim 1, wherein one or more compounds selected from the group consisting of 1,4-phenylene diisocyanate, 2,4- and/or 2,6-toluylene diisocyanate, 1,5-naphthylene diisocyanate, 2,4'- or 4,4'-diphenylmethane diisocyanate, triphenylmethane 4,4',4''-triisocyanate and tris (p-isocyanatophenyl) thiophosphate, one or more secondary products of the abovementioned monomeric isocyanates having a urethane, urea, carbodiimide, acylurea, isocyanurate, allophanate, biuret, oxadiazintrione, uretdione or iminooxadiazinedione structure and mixtures of the abovementioned compounds, are used in A).

3. Process according to claim 1, wherein one or more compounds of the group consisting of acrylates, methacrylates, maleinates, fumarates, maleimides, acrylamides, vinyl ethers, propenyl ethers, allyl ethers and compounds containing dicyclopentadienyl units, which have at least one group reactive towards isocyanates per molecule, are used in B).

4. Process according to claim 1, wherein one or more compounds of the group consisting of 2-hydroxyethyl acrylate, hydroxypropyl acrylate, 4-hydroxybutyl acrylate, poly (ε-caprolactone) mono(meth)acrylates, pentaerythrityl triacrylate and the reaction product of acrylic acid with glycidyl methacrylate are used in B).

5. Olefinically unsaturated aromatic urethanes obtained according to claim 1.

6. Urethane (meth)acrylate comprising at least one structural unit of the formula

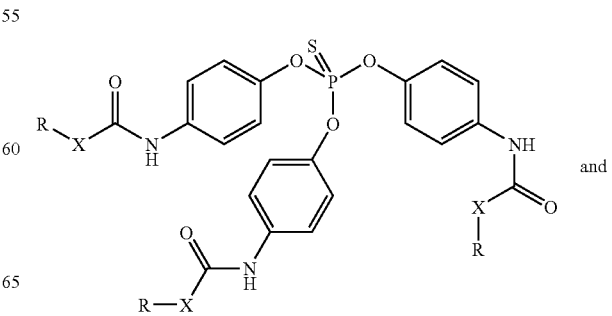

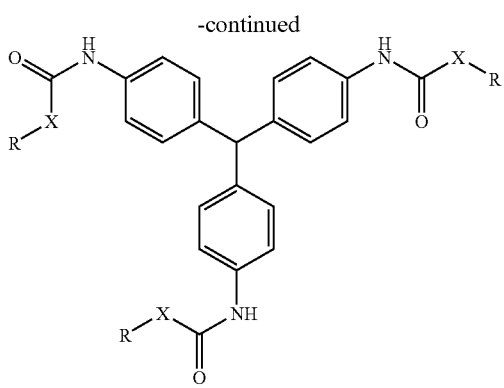

in which X is oxygen, amino or sulfur and

R comprises at least 30 mol % of olefinically unsaturated hydrocarbon radicals optionally containing heteroatoms and not more than 70 mol % of hydrocarbon radicals optionally containing heteroatoms, which are free of olefinically unsaturated groups.

7. Urethane (meth)acrylate according to claim 6, wherein the olefinically unsaturated hydrocarbon radicals optionally containing heteroatoms are ethyl acrylate, propyl acrylate and/or butyl acrylate radicals and the hydrocarbon radicals optionally containing heteroatoms, which are free of olefinically unsaturated groups, are 9H-carbazole, 9-ethyl-9H-carbazole, naphthalene, methylnaphthalene, N-ethylphthalimide, benzene, ethylbenzene, (p-chloro)ethylbenzene and/or triphenylmethane radicals.

8. Urethane (meth)acrylate according to claim 6, prepared by reacting tris(p-isocyanatophenyl) thiophosphate and/or triphenylmethane 4,4',4"-triisocyanate with isocyanate-reactive compounds having at least one radiation-curable olefinically unsaturated double bond.

9. Holographic media prepared from a) olefinically unsaturated urethanes according to claim 5, b) an isocyanate component, c) an isocyanate-reactive component, and d) a photoinitiator.

10. Holographic media prepared from a) urethane (meth) acrylates according to claim 6, b) an isocyanate component, c) an isocyanate-reactive component, and d) a photoinitiator.

* * * * *